United States Patent [19]

Shimohigashi

[11] 4,367,540
[45] Jan. 4, 1983

[54] DYNAMIC MEMORY WITH AN INTERCHANGEABLE PAIR OF DATA LINES AND SENSE AMPLIFIERS

[75] Inventor: Katsuhiro Shimohigashi, Musashimurayama, Japan

[73] Assignee: Hitachi, Ltd., Tokyo, Japan

[21] Appl. No.: 218,726

[22] Filed: Dec. 22, 1980

[30] Foreign Application Priority Data

Dec. 21, 1979 [JP] Japan .................................. 54/165574

[51] Int. Cl.³ .............................................. G11C 13/00
[52] U.S. Cl. ................................... 365/207; 365/189; 365/230
[58] Field of Search ................. 365/174, 207, 189, 230

[56] References Cited

U.S. PATENT DOCUMENTS 4,301,518 11/1981 Klass .................................... 365/207

Primary Examiner—Terrell W. Fears
Attorney, Agent, or Firm—Antonelli, Terry & Wands

[57] ABSTRACT

Four adjacent data lines are divided into two pairs. A first pair of the data lines is connected to one differential sense amplifier and a second pair of the data lines is connected to another differential sense amplifier, and vice versa, depending upon from which of the four data lines information are to be read out.

14 Claims, 1 Drawing Figure

DYNAMIC MEMORY WITH AN INTERCHANGEABLE PAIR OF DATA LINES AND SENSE AMPLIFIERS

BACKGROUND OF THE INVENTION

This invention relates to a memory of high density, and more particularly to a dynamic memory which employs MOS transistors (hereinbelow, termed "MOSTs").

In a prior-art dynamic memory employing MOSTs, a memory cell consists of one N-channel MOST and a capacitance for storing charges as is connected to the MOST. With the progress of the semiconductor integrated circuit technology, it has been requested to render the size of a memory cell smaller and smaller. As the size of the memory cell becomes smaller, the amplitude of a signal which is read out from the memory cell decreases more. Accordingly, a sense amplifier for detecting the signal from the memory cell has been requested to become increasingly high in performance and has inevitably resulted in occupying a large space. In the prior art, a large number of memory cells are connected to a pair of data lines, to which a sense amplifier for differentially amplifying voltages on these data lines is connected. A large number of such structural units are juxtaposed to construct the memory. In such prior-art memory, the size of the sense amplifier is larger than that of the memory cell. Therefore, even when the memory cell size is reduced, the interval of the data lines which are connected to different sense amplifiers cannot be made smaller. For this reason, it is difficult to array a larger number of memory cells on a single semiconductor substrate. Especially in case where the memory cell of smaller size is to be employed as described above, it is requested to enhance the performance of the sense amplifier, and it is therefore impossible to make the size of the sense amplifier small. Accordingly, the interval of the data lines cannot be reduced even when the memory cell size is made small.

SUMMARY OF THE INVENTION

This invention has for its object to solve the problem of the prior art as described above, and to provide a memory which can render the intervals of data lines small even when sense amplifiers of comparatively large size are employed, whereby memory cells can be arrayed at a higher density.

To the accomplishment of the object, according to this invention, four data lines arranged in proximity are divided into two pairs, and one pair of the data lines is connected to one of a pair of differential amplifiers and the other pair of the data lines to the other differential amplifier in an interchangeable fashion so as to externally deliver an amplified output from only either of the pair of differential amplifiers.

BRIEF DESCRIPTION OF THE DRAWING

The single FIGURE shows an embodiment of the present invention.

DETAILED DESCRIPTION OF THE PREFERRED EMBODIMENTS

Figure 1:
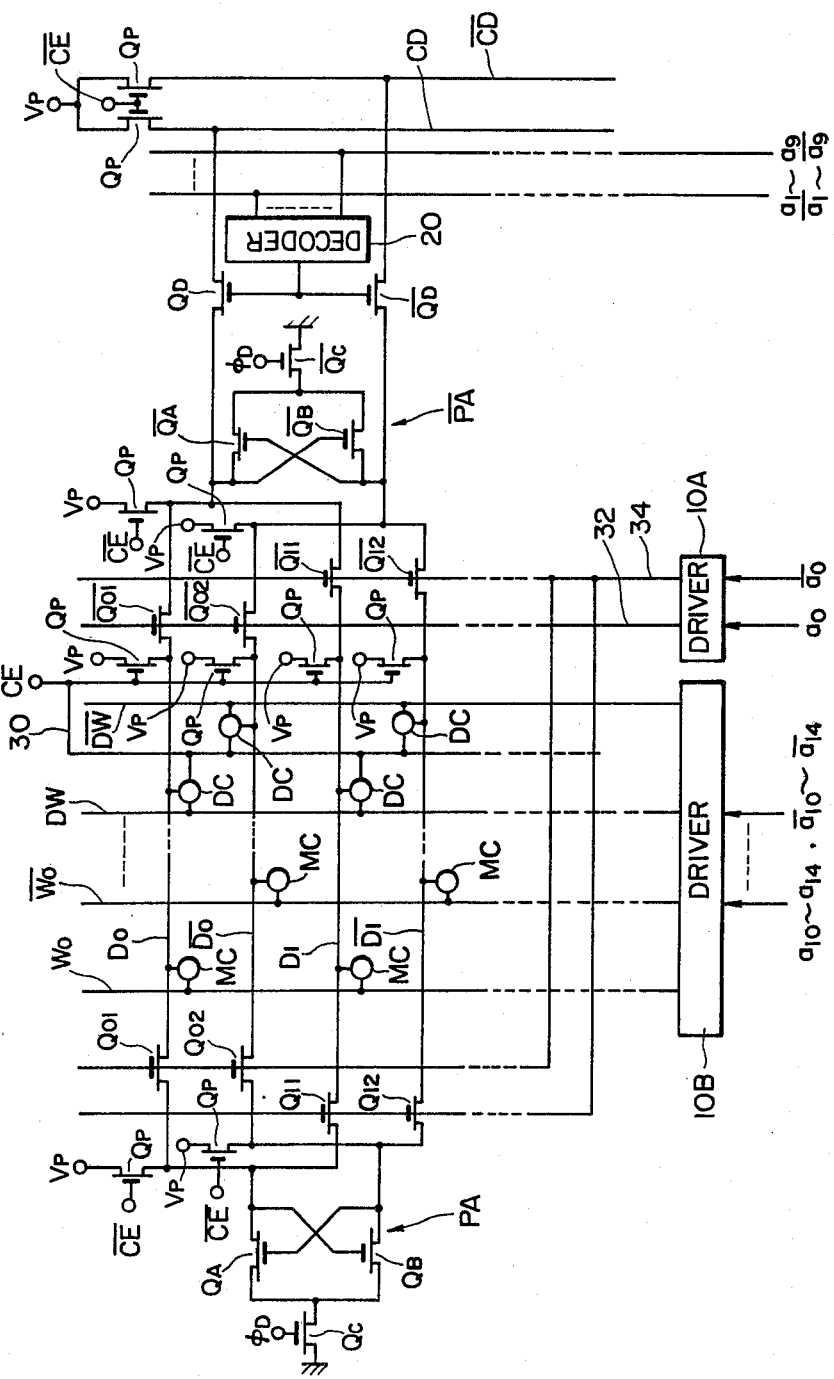

Referring to the FIGURE, a plurality of word lines $W_O, \overline{W_O}, \ldots$ and a pair of dummy word lines DW and $\overline{DW}$ are disposed in a manner to orthogonally intersect data lines $D_O, \overline{D_O}, D_1$ and $\overline{D_1}$ arrayed in parallel and in proximity to one another. Pre-amplifiers PA and $\overline{PA}$ made up of flip-flops are respectively connected on the left and right of these data lines. Memory cells MC are disposed at the points of intersection between the word line $W_O$ and the data lines $D_O$ and $D_1$, while memory cells MC are disposed at the points of intersection between the word line $\overline{W_O}$ and the data lines $\overline{D_O}$ and $\overline{D_1}$. In this manner, the memory cell MC is connected at only one of the two points of intersection between each pair of data lines and each word line. Likewise, a dummy cell DC is disposed at only one of the two points of intersection between each of the pair of dummy word lines DW and $\overline{DW}$ and each pair of data lines. The same applies to other data lines and word lines not shown. The technique in which the memory cell (including the dummy cell) is disposed at only one of the two points of intersection between one pair of adjacent data lines and one word line (including the dummy word line) as thus far described, is disclosed in the specification of U.S. Pat. No. 4,044,340. Hereinbelow a memory employing N-channel MOSTs will be referred to for brevity's sake, but this invention can be applied also to a memory employing P-channel MOSTs by inverting the polarities of voltages.

The memory cell MC is a known memory cell of the transistor type which consists of one MOST and a capacitance for storing information, while the dummy cell DC is a known dummy cell which has one MOST, a capacitance for storing a reference voltage, and one MOST connected in parallel with the capacitance.

The pre-amplifier PA consists of cross-connected MOSTs $Q_A$ and $Q_B$, and a MOST $Q_C$ for connecting the sources of these MOSTs $Q_A$ and $Q_B$ to the earth. Likewise, the pre-amplifier $\overline{PA}$ consists of cross-connected MOSTs $\overline{Q_A}$ and $\overline{Q_B}$ and a MOST $\overline{Q_C}$ for connecting the sources of these MOSTs $\overline{Q_A}$ and $\overline{Q_B}$ to the earth. When a pulse $\phi_D$ which is impressed on the gates of the MOSTs $Q_C$ and $\overline{Q_C}$ has become its high level, the pre-amplifiers PA and $\overline{PA}$ fall into their active states. The drain of the MOST $Q_A$ within the pre-amplifier PA is connected to the data lines $D_O$ and $D_1$ through MOSTs $Q_{01}$ and $Q_{11}$ respectively, while the drain of the MOST $Q_B$ within the pre-amplifier PA is connected to the data lines $\overline{D_0}$ and $\overline{D_1}$ through MOSTs $Q_{02}$ and $Q_{12}$ respectively. Similarly, the drain of the MOST $\overline{Q_A}$ within the pre-amplifier $\overline{PA}$ is connected to the data lines $D_0$ and $D_1$ through MOSTs $\overline{Q_{01}}$ and $\overline{Q_{11}}$ respectively, while the drain of the MOST $\overline{Q_B}$ is connected to the data lines $\overline{D_0}$ and $\overline{D_1}$ through MOSTs $\overline{Q_{02}}$ and $\overline{Q_{12}}$ respectively. The drains of the MOSTs $\overline{Q_A}$ and $\overline{Q_B}$ are further connected to common data lines CD and $\overline{CD}$ through MOSTs $Q_D$ and $\overline{Q_D}$ respectively.

In the memory of the present embodiment, memory cell arrays the unit of which consists of one pair of pre-amplifiers and two pairs of data lines as illustrated in the FIGURE are juxtaposed in the vertical direction as viewed in the FIGURE, but they are not fully shown for the sake of brevity. Memory cells within the memory cell arrays not shown are connected to word lines $W_0, \overline{W_0}, \ldots$ and dummy word lines DW and $\overline{DW}$ similarly to the illustrated memory cells.

Before the read-out of the memory cell, MOSTs $Q_P$ connected to the common data lines CD and $\overline{CD}$, the data lines $D_0, \overline{D_0}, D_1$ and $\overline{D_1}$ and the drains of the MOSTs $Q_A, Q_B, \overline{Q_A}$ and $\overline{Q_B}$ precharge these data lines and drains of the MOSTs up to a supply voltage $V_P$ in response to a precharging signal $\overline{CE}$ of high level applied to the gates of the MOSTs $Q_P$. At this time, the dummy cells DC are supplied with the precharging signal $\overline{CE}$ through a line 30 and are set into their initial states. During the period of the precharging, the signal $\phi_D$ is held at its low level, so that the pre-amplifiers PA and $\overline{PA}$ are in their inactive states. Similarly, drivers 10A and 10B and a decoder 20 are constructed so as to hold their outputs at the low levels thereof during the precharging.

In the present embodiment, fifteen address signals $a_0$–$a_{14}$ and address signals $\overline{a_0}$–$\overline{a_{14}}$ complementary thereto are used.

After the end of the precharging period, the driver 10A delivers a voltage of high level onto a line 32 when the address signal $a_0$ is at its high level, and it delivers a voltage of high level onto a line 34 when the address signal $\overline{a_0}$ is at its high level.

On the other hand, also the decoder 20 delivers a voltage of high level to turn "on" the MOSTs $Q_D$ and $\overline{Q_D}$ when the address signals $a_1$–$a_9$ and $\overline{a_1}$–$\overline{a_9}$ have predetermined values after the end of the precharging period.

The driver 10B delivers a voltage of high level to one of the word lines $W_O$, $\overline{W_O}$, ... and either of the dummy word lines DW and $\overline{DW}$ in response to the address signals $a_{10}$–$a_{14}$ and $\overline{a_{10}}$–$\overline{a_{14}}$ after the end of the precharging period.

The driver 10B supplies the voltage of high level selectively to either of the dummy word lines DW and $\overline{DW}$ so as to select the memory cell connected to one data line of each pair of data lines and the dummy cell DC connected to the other data line.

Now, let it be supposed that the memory cell to be selected is the memory cell MC located at the point of intersection between the data line $D_O$ and the word line $W_O$. The driver 10B delivers the high voltage selectively to the word line $W_O$ and the dummy word line $\overline{DW}$ in response to the address signals. As a result, this memory cell and also all the other memory cells connected to the word line $W_O$ are read out. Accordingly, the two memory cells MC located at the points of intersection between the data lines $D_0$ and $D_1$ and the word line $W_O$ are read out, and the voltages of the data lines $D_0$ and $D_1$ vary in accordance with signals stored in the memory cells MC read out. Likewise, the two dummy cells DC located at the points of intersection between the dummy word line $\overline{DW}$ and the data lines $\overline{D_0}$ and $\overline{D_1}$ are read out, and the voltages of the data lines $\overline{D_0}$ and $\overline{D_1}$ are set at a reference voltage.

In the present embodiment, in case of reading out the memory cells MC connected to the even-numbered data line $D_O$ or $\overline{D_O}$ as reckoned from above, the address signals $a_O$ and $\overline{a_O}$ are respectively held at the high level and the low level. In order to read out the memory cells MC connected to the odd-numbered data line $D_1$ or $\overline{D_1}$ as reckoned from above, the address signals $a_O$ and $\overline{a_O}$ are respectively held at the low level and the high level.

Accordingly, in case where the memory cell to be selected is the memory cell MC located at the point of intersection between the word line $W_O$ and the data line $D_O$, the lines 32 and 34 are respectively supplied with the high voltage and the low voltage by the driver 10A.

In this manner, the voltages of the word lines (including the dummy word lines) and the voltages of the lines 32 and 34 are determined after the end of the precharging period. Simultaneously therewith, the pulse $\phi_D$ is shifted from the low level to the high level, so that the pre-amplifiers PA and $\overline{PA}$ are brought into the active states.

When the voltages on the lines 32 and 34 are at the high level and the low level respectively, the MOSTs $\overline{Q_{01}}$, $\overline{Q_{02}}$, $Q_{11}$ and $Q_{12}$ turn "on", and the MOSTs $Q_{01}$, $Q_{02}$, $\overline{Q_{11}}$ and $\overline{Q_{12}}$ turn "off". Accordingly, the data lines $D_O$ and $\overline{D_O}$ are connected to the pre-amplifier $\overline{PA}$ disposed on the right side thereof, through the MOSTs $\overline{Q_{01}}$ and $\overline{Q_{02}}$ respectively. The voltages of these data lines are differentially amplified, and one of them maintains a value close to the original precharging level $V_P$, while the other is discharged down to the earth level. When the memory cell on the data line $D_O$ or $\overline{D_O}$ is to be selected, the decoder 20 is supplying the high voltage in response to the address signals $a_1$–$a_9$ and $\overline{a_1}$–$\overline{a_9}$, and hence, the MOSTs $Q_D$ and $\overline{Q_D}$ are in the "on" states. Accordingly, the drains of the MOSTs $\overline{Q_A}$ and $\overline{Q_B}$ of the pre-amplifier $\overline{PA}$ are respectively connected to the common data lines CD and $\overline{CD}$. Consequently, the common data lines CD and $\overline{CD}$ are respectively changed so as to have the same voltages as those of the data lines $D_O$ and $\overline{D_O}$. Thus, the voltages of the common data lines CD and $\overline{CD}$ become values which correspond to the stored signals of the memory cells MC read out.

On the other hand, the data lines $D_1$ and $\overline{D_1}$ are connected to the pre-amplifier PA disposed on the left side thereof, through the MOSTs $Q_{11}$ and $Q_{12}$ respectively. The voltages of these data lines are differentially amplified, and one of them changes to the high level and the other to the low level.

The stored signals of the other memory cells located at the points of intersection between the word line $W_O$ and the other data lines not shown are similarly read out, and are similarly amplified by the pre-amplifiers not shown.

In case where the memory cell to be read out is the memory cell MC located at the point of intersection between the word line $W_O$ and the data line $D_1$, the lines 32 and 34 are respectively supplied with the voltages of the low level and the high level by the driver 10A. Accordingly, the MOSTs $Q_{01}$, $Q_{02}$, $\overline{Q_{11}}$ and $\overline{Q_{12}}$ turn "on", and the MOSTs $\overline{Q_{01}}$, $\overline{Q_{02}}$, $Q_{11}$ and $Q_{12}$ turn "off". As a result, the voltages of the data lines $D_O$ and $\overline{D_O}$ are differentially amplified by the pre-amplifier PA, and those of the data lines $D_1$ and $\overline{D_1}$ are differentially amplified by the pre-amplifier $\overline{PA}$. Outputs of the pre-amplifier $\overline{PA}$ are similarly supplied to the common data lines CD and $\overline{CD}$. In this manner, even when the word line $W_O$ has been selectively made the high voltage to read out the plurality of memory cells MC connected thereto, the stored signals of these memory cells are respectively amplified by the pre-amplifier PA or $\overline{PA}$. It is accordingly possible to store or write the amplified voltages again into these memory cells. Therefore, even when the read-out of the memory cells is the destructive read-out as in conventional one-transistor memory cells, the original stored signals can be respectively written into the plurality of memory cells read out.

After the read-out of the memory cells, all the signals are returned to the original levels.

When the memory cell other than the memory cells connected to the data line $D_O$, $\overline{D_O}$, $D_1$ or $\overline{D_1}$ is to be selected, the decoder 20 delivers the voltage of the low level to turn "off" the MOSTs $Q_D$ and $\overline{Q_D}$. Accordingly, the outputs of the pre-amplifier $\overline{PA}$ are not supplied to the common data lines CD and $\overline{CD}$.

As described above, the pre-amplifiers are disposed on the left and right of the two pairs of data lines, and the connections between the respective pairs of data lines and the pre-amplifiers are interchanged, whereby the memory cell to be read out as is connected to the selected word line can be read out and also the other memory cells connected to this word line can be read out and rewritten.

In storing a signal into a desired memory cell externally in the present embodiment, after performing the above reading operation as to the particular memory cell and before returning all the signals to their levels at the precharging, the voltages of the common data lines CD and $\overline{CD}$ are put into the corresponding ones of the high and low levels in dependence on the signal to be written in. After the end of the writing operation, all the signals are returned to the original levels at the precharging.

In the foregoing embodiment, it is possible to dispense with those of the precharging MOSTs $Q_P$ which are connected to the respective data lines and the pre-amplifier $\overline{PA}$. To this end, the driver 10A is constructed so as to supply the lines 32 and 34 with the voltage of the high level during the precharging period and to supply them with the voltages of the levels responsive to the "high" and "low" of the address signals $a_O$ and $\overline{a_O}$ respectively after the end of the precharging period. With such driver 10A, during the precharging period, the MOSTs $Q_{01}$, $\overline{Q_{01}}$, $Q_{02}$, $\overline{Q_{02}}$, $Q_{11}$, $\overline{Q_{11}}$, $Q_{12}$ and $\overline{Q_{12}}$ turn "on", and hence, the MOSTs $Q_P$ connected to the pre-amplifier PA can precharge the respective data lines $D_0$, $\overline{D_0}$, $D_1$ and $\overline{D_1}$ and also the drains of the MOSTs $\overline{Q_A}$ and $\overline{Q_B}$ of the pre-amplifier $\overline{PA}$.

As set forth above, according to this invention, the memory which can make the intervals of the data lines small is provided. This invention is not restricted to the embodiments described above, but it shall include modifications suggestible by one skilled in the art within the scope of the appended claims.

I claim:

1. A memory comprising:
   first and second data lines,
   third and fourth data lines which are respectively arranged in proximity to and in parallel with said first and second data lines,
   a plurality of word lines which are disposed in a manner to intersect said first to fourth data lines,
   a plurality of memory cells which are respectively disposed at points of intersection between said first to fourth data lines and said plurality of word lines,
   first and second differential amplifiers which are disposed in proximity to end parts of said first to fourth data lines,
   first switching means for interchangeably connecting the pair of said first and second data lines to said first and second differential amplifiers in order to differentially amplify voltages of said first and second data lines,
   second switching means for connecting the pair of said third and fourth lines to that one of said first and second differential amplifiers which is opposite to said differential amplifier having said pair of said first and second data lines connected thereto, in order to differentially amplify voltages of said third and fourth data lines, and
   means for delivering an amplified output of said first differential amplifier as a memory cell read-out information.

2. A memory as defined in claim 1, wherein said first and second data lines are arranged in proximity to and in parallel with each other, while said third and fourth data lines are arranged in proximity to and in parallel with each other.

3. A memory as defined in claim 1, wherein said first to fourth data lines are arranged in this numbered order.

4. A memory as defined in claim 3, wherein the memory cells are disposed at one of the two points of intersection between said first and second data lines and each of said plurality of word lines, and at one of the two points of intersection between said third and fourth data lines and each of said plurality of word lines.

5. A memory as defined in any of claims 2, 3 or 4, wherein said first differential amplifier is disposed in proximity to one end of each of said first to fourth data lines, while said second differential amplifier is disposed in proximity to the other end of each of said first to fourth data lines.

6. A memory as defined in claim 5, wherein each of said first and second differential amplifiers includes a flip-flop which consists of a pair of cross-connected transistors.

7. A memory as defined in claim 6, wherein said first switching means includes first and second transistors for connecting said first and second data lines to said first differential amplifier respectively, and third and fourth transistors for connecting said first and second data lines to said second differential amplifier respectively, and wherein said second switching means includes fifth and sixth transistors for connecting said third and fourth data lines to said first differential amplifier respectively, and seventh and eighth transistors for connecting said third and fourth data lines to said second differential amplifier respectively.

8. A memory as defined in claim 7, wherein said first, second, seventh and eighth transistors have their conductions controlled by a first common control signal, while said third, fourth, fifth and sixth transistors have their conductions controlled by a second common control signal which is complementary to said first common control signal.

9. A memory as defined in claim 8, wherein said first and second control signals are a pair of address signals which are complementary to each other.

10. A memory as defined in claim 9, wherein a pair of output terminals of said first differential amplifier are connected to a pair of common data lines through a pair of ninth and tenth transistors.

11. A memory as defined in claim 6, wherein each of said first and second differential amplifiers expands a difference of the voltages of the pair of data lines to which it is connected, at the differential amplification.

12. A memory as defined in claim 10, wherein the memory cell has its stored signal destroyed at read-out and has a voltage of the data line after the read-out stored thereinto as its stored signal.

13. A memory as defined in claim 11, wherein the memory cell includes a capacitance for storing a signal, and a transistor for connecting said capacitance and the corresponding data line.

14. A memory as defined in claim 7, further comprising common precharging means for precharging said first to fourth data lines, said first to eighth transistors being brought into conductive states at the precharging.

* * * * *